(12) United States Patent
Varaprasad et al.

(10) Patent No.: US 10,329,452 B2
(45) Date of Patent: Jun. 25, 2019

(54) MATERIALS AND SPIN COATING METHODS SUITABLE FOR ADVANCED PLANARIZATION APPLICATIONS

(71) Applicant: Honeywell International Inc., Morris Plains, NJ (US)

(72) Inventors: Desaraju Varaprasad, Dublin, CA (US); Ronald R. Katsanes, Newark, CA (US); Songyuan Xie, Palo Alto, CA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/609,818

(22) Filed: May 31, 2017

(65) Prior Publication Data
US 2017/0362448 A1 Dec. 21, 2017

Related U.S. Application Data

(60) Provisional application No. 62/352,783, filed on Jun. 21, 2016.

(51) Int. Cl.
| | |
|---|---|
| *C08K 5/05* | (2006.01) |
| *C08K 5/06* | (2006.01) |
| *C08K 5/07* | (2006.01) |
| *C08K 5/10* | (2006.01) |
| *C09D 7/20* | (2018.01) |
| *C09D 183/04* | (2006.01) |

(Continued)

(52) U.S. Cl.
CPC .............. *C09D 183/04* (2013.01); *C09D 7/20* (2018.01); *C09D 201/02* (2013.01); *H01L 21/02123* (2013.01); *H01L 21/02126* (2013.01); *H01L 21/02216* (2013.01); *H01L 21/02282* (2013.01); *C08K 5/05* (2013.01); *C08K 5/06* (2013.01); *C08K 5/07* (2013.01); *C08K 5/10* (2013.01)

(58) Field of Classification Search
CPC ........... H01L 21/02282; H01L 21/3121; H01L 21/3122; H01L 21/316; H01L 21/31625; C09D 183/04; C09D 7/20; C09D 201/02
USPC ........... 257/79; 438/782, 760, 780, 681, 756
See application file for complete search history.

(56) References Cited

U.S. PATENT DOCUMENTS

| | | |
|---|---|---|
| 5,003,062 A | 3/1991 | Yen |
| 5,837,319 A | 11/1998 | Walters et al. |

(Continued)

FOREIGN PATENT DOCUMENTS

| | | |
|---|---|---|
| EP | 1427541 B1 | 11/2010 |
| JP | 2000301833 A | 10/2000 |
| JP | 4803591 B2 | 8/2011 |

OTHER PUBLICATIONS

International Search Report and Written Opinion issued in PCT/US2017/037376, dated Aug. 31, 2017, 13 pages.

*Primary Examiner* — Nduka E Ojeh
(74) *Attorney, Agent, or Firm* — Faegre Baker Daniels LLP

(57) ABSTRACT

A composition is provided including a resin including one or more silicon-based materials, one or more organic-based materials, or a combination of silicon-based materials and organic-based materials. The composition further includes a first solvent having a boiling point from 140° C. to 250° C. and a second solvent having a boiling point from 50° C. to 110° C., wherein the a weight ratio of the first solvent to the second solvent is from 1:1 to 1:5. Methods for applying coatings to substrates are also provided.

11 Claims, 3 Drawing Sheets

(51) Int. Cl.
   *C09D 201/02*   (2006.01)
   *H01L 21/02*    (2006.01)
   *H01L 21/31*    (2006.01)
   *H01L 21/469*   (2006.01)

(56) References Cited

U.S. PATENT DOCUMENTS

| | | | |
|---|---|---|---|
| 6,890,595 B2* | 5/2005 | Lee | G03F 7/162 |
| | | | 118/320 |
| 7,087,526 B1* | 8/2006 | Zhuang | C23C 26/00 |
| | | | 257/79 |
| 7,718,551 B2 | 5/2010 | Liu et al. | |
| 8,505,479 B2 | 8/2013 | Yoshihara et al. | |
| 8,864,898 B2 | 10/2014 | Varaprasad et al. | |
| 2001/0029111 A1* | 10/2001 | You | B05D 1/005 |
| | | | 438/782 |
| 2003/0146416 A1* | 8/2003 | Takei | C08L 25/18 |
| | | | 252/500 |
| 2003/0232495 A1* | 12/2003 | Moghadam | B05D 1/60 |
| | | | 438/623 |
| 2004/0247844 A1* | 12/2004 | Kijima | H01L 21/31691 |
| | | | 428/210 |
| 2007/0004219 A1* | 1/2007 | Whitman | H01L 21/76232 |
| | | | 438/756 |
| 2008/0073613 A1* | 3/2008 | Sugiura | B05D 3/207 |
| | | | 252/62.54 |
| 2012/0178265 A1* | 7/2012 | Miyahara | H01L 21/0206 |
| | | | 438/782 |
| 2013/0276668 A1 | 10/2013 | Ranka et al. | |
| 2014/0240645 A1 | 8/2014 | Shim et al. | |

* cited by examiner

MATERIALS AND SPIN COATING METHODS SUITABLE FOR ADVANCED PLANARIZATION APPLICATIONS

CROSS REFERENCE TO RELATED APPLICATIONS

This application claims the benefit under Title 35, U.S.C. § 119(e) of U.S. Provisional Patent Application Ser. No. 62/352,783, entitled MATERIALS AND SPIN COATING METHODS SUITABLE FOR ADVANCED PLANARIZATION APPLICATIONS, filed on Jun. 21, 2016, the entire disclosure of which is expressly incorporated by reference herein.

FIELD

The present disclosure relates generally to materials, such as planarization materials, applied using spin coating methods.

BACKGROUND

Planarization is the process of increasing the flatness of semiconductor wafer surfaces using planarization techniques. Starting raw wafers for semiconductor device fabrication generally have a flat or planar surface into which a plurality of gaps or trenches is etched. As the wafer goes through the various steps of device fabrication, layers of different materials, shapes, and depths are deposited over the wafer surface through different growth and deposition techniques. At times, portions of these materials already deposited over the wafer need to be removed. This series of material growth, deposition, and removal steps decreases the flatness or planarity of the wafer surface.

Modern fabrication techniques that increase the number of layers applied to the wafer while decreasing the width of the etched lines or trenches may increase the likelihood of wafer non-planarity.

Typical coating formulations use a single solvent or a combination of solvents with similar boiling points. Generally, a coating formulation with a high boiling point solvent has a higher viscosity, and a coating formulation with a low boiling point solvent has a lower viscosity. While coating formulations with a high viscosity may be desirable for providing thicker coatings, such coatings may not adequately provide fill of gaps or trenches, in particular gaps or trenches having relatively high aspect ratios. Conversely, less viscous coating formulations typically provide adequate gap filling ability, but the lower viscosity typically results in thinner layers of the coating formed along the wafer surface.

Improvements in the foregoing are desired, wherein surface features of an underlying substrate may be completely filled with high solid content planarizing formulations.

SUMMARY

The present disclosure provides planarization coating formulations suitable for planarization of trenches having high aspect ratio structures by spin coating processes. The present disclosure further provides a coating formulation with a mixture of solvents of varying boiling points, wherein the coating formulation is dispersed onto the wafer. The wafer is then spun to evaporate the low BP solvent; after which, a high revolutions per minute (RPM) spin is applied to the wafer to establish a desired thickness of the coating. Then, the wafer is given a stop-time to facilitate the flow of the formulation along the surface of the wafer, and the wafer is subsequently cured.

In one exemplary embodiment, a composition is provided. The Composition includes a resin including one or more silicon-based materials, one or more organic-based materials, or a combination of silicon-based materials and organic-based materials. The composition further includes at least one first solvent having a boiling point from 140° C. to 250° C. and at least one second solvent having a boiling point from 50° C. to 110° C., wherein the a weight ratio of the first solvent to the second solvent is from 1:1 to 1:5. In a more particular embodiment, the weight ratio of the first solvent to the second solvent is from 1:3 to 1:4.

In one more particular embodiment of any of the above embodiments, the first solvent first solvent includes at least one solvent selected from the group consisting of: dipropylene glycol methyl ether, tripropylene glycol methyl ether, propylene glycol monomethyl ether acetate, n-propoxypropanol, and propylene carbonate, gammabutryo lactone, ethyl lactate, and ethyl ester. In a still more particular embodiment, the first solvent is propylene glycol monomethyl ether acetate.

In one more particular embodiment of any of the above embodiments, the second solvent includes at least one solvent selected from the group consisting of: acetone, ethyl acetate, methanol, ethanol, propanol, butanol, and isopropyl alcohol. In one even more particular embodiment, the second solvent is selected from the group consisting of acetone and isopropyl alcohol. In another more particular embodiment, the second solvent is acetone. In still another more particular embodiment, the second solvent is isopropyl alcohol.

In a more particular embodiment of any of the above embodiments, the resin comprises one or more silicon-based materials formed from one or more organoalkoxysilane precursors selected from the group consisting of: tetraethylorthosilicate (TEOS), methyltrimethoxysilane (MTMOS), methyltriethoxysilane (MTEOS), dimethyldiethoxysilane (DMDEOS), phenyl triethoxysilane (PTEOS), vinyltriethoxysilane (VTEOS), dimethyldimethoxysilane, phenyltrimethoxysilane, and combinations of the foregoing. In an even more particular embodiment, the first solvent is selected from the group consisting of: dipropylene glycol methyl ether, tripropylene glycol methyl ether, propylene glycol monomethyl ether acetate, n-propoxypropanol, and propylene carbonate, gammabutryo lactone, ethyl lactate, and ethyl ester, and wherein the second solvent is selected from the group consisting of: acetone, ethyl acetate, methanol, ethanol, propanol, butanol, and isopropyl alcohol. In a still more particular embodiment, the first solvent is propylene glycol monomethyl ether acetate and the second solvent is isopropyl alcohol.

In a more particular embodiment of any of the above embodiments, the resin comprises one or more organic-based materials selected from the group consisting of o-cresol, formaldehyde, and novolac-based resins. In an even more particular embodiment, the first solvent is selected from the group consisting of: dipropylene glycol methyl ether, tripropylene glycol methyl ether, propylene glycol monomethyl ether acetate, n-propoxypropanol, and propylene carbonate, gammabutryo lactone, and ethyl lactate, and ethyl ester, and wherein the second solvent is selected from the group consisting of: acetone, ethyl acetate, methanol, ethanol, propanol, butanol, and isopropyl alcohol. In a still more particular embodiment, the first solvent is propylene glycol monomethyl ether acetate and the second solvent is selected from acetone and isopropyl alcohol.

In one exemplary embodiment, a method of applying a coating onto a substrate is provided. The method includes dispensing the coating onto the substrate at a first speed; spinning the coating at a second speed that is less than or equal to the first speed such that the coating spreads over the surface of the substrate and achieves a planar surface; increasing the speed to a third speed that is greater than the first speed and the second speed such that a desired film thickness is established; and providing a stop time to facilitate flow to achieve the planar surface. In a more particular embodiment, the first speed is between 100 revolutions per minute and 500 revolutions per minute; the second speed is between 0 revolutions per minute and 500 revolutions per minute; and the third speed is between 1500 revolutions per minute and 5000 revolutions per minute. In one embodiment, the coating includes a resin comprising one or more silicon-based materials, one or more organic-based materials, or a combination of silicon-based materials and organic-based materials; at least one first solvent having a boiling point from 140° C. to 250° C.; and at least one second solvent having a boiling point from 50° C. to 120° C.; wherein a weight ratio of the first solvent to the second solvent is from 1:1 to 1:5. In another embodiment, the coating comprises a composition of any of the above embodiments.

In another exemplary embodiment, a method of applying a coating onto a substrate is provided. The method includes dispensing the coating onto the substrate at a first speed; spinning the coating at a second speed that is less than or equal to the first speed such that the coating spreads over the surface of the substrate, achieves a planar surface, and evaporates the second solvent; increasing the speed to a third speed that is greater than the first speed and the second speed such that a desired film thickness is established; and providing a stop time to facilitate flow to achieve the planar surface; wherein the first speed is between 100 revolutions per minute and 500 revolutions per minute; the second speed is between 0 revolutions per minute and 500 revolutions per minute; and the third speed is between 1500 revolutions per minute and 5000 revolutions per minute. In one embodiment, the coating includes a resin comprising one or more silicon-based materials, one or more organic-based materials, or a combination of silicon-based materials and organic-based materials; at least one first solvent having a boiling point from 140° C. to 250° C.; and at least one second solvent having a boiling point from 50° C. to 120° C.; wherein a weight ratio of the first solvent to the second solvent is from 1:1 to 1:5. In another embodiment, the coating comprises a composition of any of the above embodiments. In a more particular embodiment of any of the above embodiments, the first solvent includes at least one solvent selected from the group consisting of: dipropylene glycol methyl ether, tripropylene glycol methyl ether, propylene glycol monomethyl ether acetate, n-propoxypropanol, and propylene carbonate, gammabutryo lactone, and ethyl lactate, and ethyl ester. In an even more particular embodiment, the first solvent is propylene glycol monomethyl ether acetate. In another more particular embodiment, the first solvent is isopropyl alcohol.

In another more particular embodiment of any of the above embodiments, the second solvent includes at least one solvent selected from the group consisting of: acetone, ethyl acetate, methanol, ethanol, propanol, butanol, and isopropyl alcohol. In an even more particular embodiment, the second solvent is selected from acetone and isopropyl alcohol.

In another more particular embodiment of any of the above embodiments, the first solvent is PGMEA and the second solvent is selected from acetone and isopropyl alcohol. In another more particular embodiment, the first solvent is isopropyl alcohol and the second solvent is acetone.

In a more particular embodiment of any of the above embodiments, the resin comprises one or more silicon-based materials. In an even more particular embodiment, the silicon-based material is formed from one or more organoalkoxysilane precursors. In an even more particular embodiment, the organoalkoxysilane precursors are selected from tetraethylorthosilicate (TEOS), methyltrimethoxysilane (MTMOS), methyltriethoxysilane (MTEOS), dimethyldiethoxysilane (DMDEOS), phenyl triethoxysilane (PTEOS), vinyltriethoxysilane (VTEOS), dimethyldimethoxysilane, phenyltrimethoxysilane, and combinations of the foregoing. In another more particular embodiment, the silicon-based material is a crosslinkable methylsiloxane polymer.

In one more particular embodiment of any of the above embodiments, the resin comprises one or more organic-based materials. In a more particular embodiment, the organic-based material is selected from the group consisting of o-cresol, formaldehyde, and novolac-based resins. In an even more particular embodiment, the organic-based material is a novolac-based resin.

In one more particular embodiment of any of the above embodiments, the composition further includes a surfactant selected from the group consisting of fluorosurfactants and silicone surfactants.

In one exemplary embodiment, a coating formed from a composition of any of the above embodiments is provided.

In one exemplary embodiment, a method of applying a coating onto a substrate is provided. The method includes dispensing the composition onto the substrate at a first speed, spinning the coating at a second speed that is less than or equal to the first speed for a first time period to allow the coating to spread over the substrate; increasing the speed to a third speed that is greater than the first speed and the second speed to establish a desired film thickness; and providing a stop time to facilitate flow to achieve the planar surface; wherein the first speed is between 100 revolutions per minute and 500 revolutions per minute; the second speed is between 0 revolutions per minute and 500 revolutions per minute; and the third speed is between 1500 revolutions per minute and 5000 revolutions per minute. In a more particular embodiment, the coating is formed from a composition of any of the above embodiments.

In one exemplary embodiment, a method of applying a coating onto a substrate is provided. The method includes dispensing the coating onto the substrate at a first speed, wherein the coating includes: a resin comprising one or more silicon-based materials, one or more organic-based materials, or a combination of silicon-based materials and organic-based materials; at least one first solvent and at least one second solvent, the first solvent and the second solvent having a boiling point from 50° C. to 120° C.; spinning the coating at a second speed that is less than or equal to the first speed such that the coating spreads over the surface of the substrate, achieves a planar surface, and evaporates the second solvent; increasing the speed to a third speed that is greater than the first speed and the second speed such that a desired film thickness is established; and providing a stop time to facilitate flow to achieve the planar surface; wherein the first speed is between 100 revolutions per minute and 500 revolutions per minute; the second speed is between 0 revolutions per minute and 500 revolutions per minute; and the third speed is between 1500 revolutions per minute and 5000 revolutions per minute.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

Corresponding reference characters indicate corresponding parts throughout the several views. The exemplifications set out herein are provided to illustrate certain exemplary embodiments and such exemplifications are not to be construed as limiting the scope in any manner.

DETAILED DESCRIPTION

I. Formulation

Figure 1:
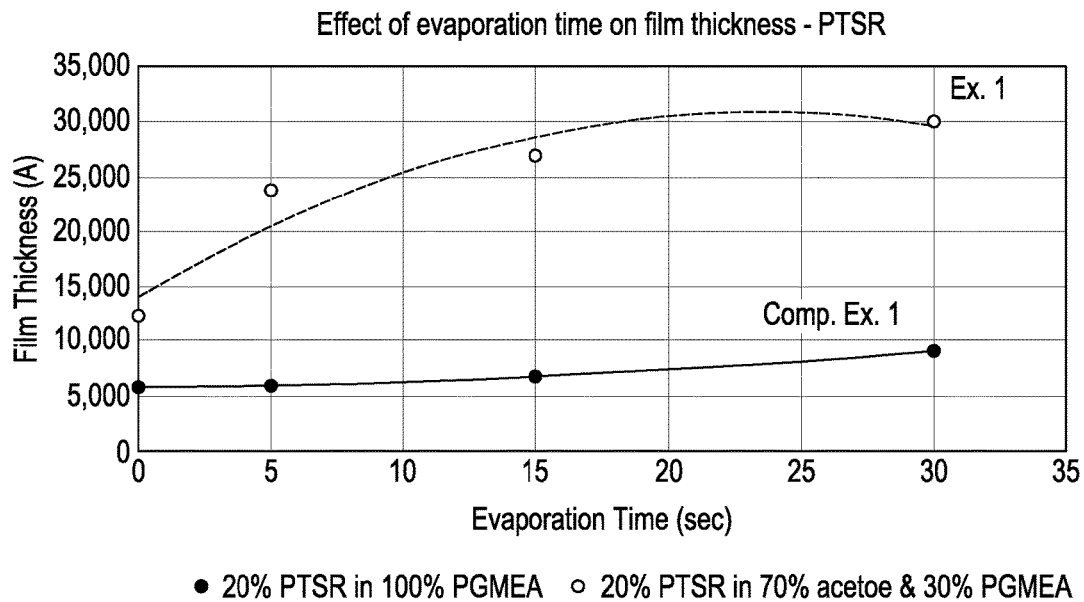
FIG. 1 is related to Example 1 and shows the effect of evaporation time on film thickness for a silicon-resin based composition.

In one exemplary embodiment, a polysiloxane formulation for planarization applications includes one or more solvents and a polymer resin. The polymer resin illustratively includes one or more silicon-based materials, one or more organic-based materials, or a combination of silicon-based materials and organic-based materials.

a. Polymer Resin i. Silicon-based Materials

In one exemplary embodiment, the formulation is provided as a liquid formulation that includes one or more crosslinkable or polymerizable silicon-based materials that form the polysiloxane coating.

In one exemplary embodiment, the formulation comprises one or more silicon-based materials in an amount as little as 1.0 wt. %, 1.5 wt. %, 2.0 wt. %, as great as 10 wt. %, 15 wt. %, 20 wt. %, based on the total weight of the formulation, or within any range defined between any two of the foregoing values, such as 1.0 wt. % to 20 wt. %, 1.5 wt. % to 15 wt. %, or 2.0 wt. % to 10 wt. %.

Exemplary silicon-based materials comprise one or more crosslinkable siloxane oligomers formed from one or more organoalkoxysilane precursors via hydrolysis and condensation reactions, and one or more siloxane polymers formed from one or more organoalkoxysilane precursors via polymerization reactions. Exemplary organoalkoxysilane precursors include tetraethyl orthosilicate (TEOS), methyltrimethoxysilane (MTMOS), methyltriethoxysilane (MTEOS), dimethyldiethoxysilane (DMDEOS), phenyl triethoxysilane (PTEOS), vinyltriethoxysilane (VTEOS), dimethyldimethoxysilane, phenyltrimethoxysilane, and combinations of the foregoing.

In some embodiments, the one or more crosslinkable siloxane oligomers comprise a methylsiloxane oligomer. In some embodiments, the methyl groups comprise as little as 0 wt. %, 1 wt. %, 2 wt. %, 5 wt. %, as great as 10 wt. %, 15 wt. %, 20 wt. % of the solids weight of the crosslinkable siloxane oligomers, or may be within any range defined between any two of the foregoing values, such as from 1 wt. % to 20 wt. %, 2 wt. % to 15 wt. %, or 5 wt. % to 15 wt. %. In some embodiments, the methyl groups comprise about 10 wt. % of the total crosslinkable siloxane oligomers.

In some embodiments, the crosslinkable siloxane oligomers have a weight average molecular weight as little as 500 Dalton, 1000 Dalton, 1250 Dalton, 1500 Dalton, as high as 1600 Dalton, 1750 Dalton, 2000 Dalton, 3000 Dalton, 5000 Dalton, or within any range defined between any two of the foregoing values, such as 500 Dalton to 5000 Dalton, or 1000 Dalton to 3000 Dalton, or 1500 Dalton to 2000 Dalton. In some embodiments, the crosslinkable siloxane oligomers have a polydispersity index (weight average molecular weight/number average molecular weight) as little as 1.10, 1.12, 1.15, as high as 1.16, 1.18, 1.20, or within any range defined between any two of the foregoing values, such as 1.10 to 1.20, 1.12 to 1.18, or 1.15 to 1.18. In some embodiments, the crosslinkable siloxane oligomers have a weight average molecular weight of about 1500 and a polydispersity index of about 1.16.

Exemplary silicon-based materials include crosslinkable methylsiloxane polymers, such as the ACCUGLASS® T-12B Spin-on Glass series of materials available from Honeywell International Inc., including materials 312B, 412B, and 512B.

ii. Organic-based Materials

In another exemplary embodiment, the present formulation includes one or more organic-based materials to form an organic coating. Exemplary organic-based materials include phenol-formaldehyde resins such as novolac-based resins.

In some embodiments, the organic-based materials have a weight average molecular weight as little as 1400 Dalton, 1500 Dalton, 1600 Dalton, as high as 2000 Dalton, 2100 Dalton, 2200 Dalton, or within any range defined between any two of the foregoing values, such as 1400 Dalton to 2200 Dalton.

Exemplary organic-based materials include novolac-based polymers, such as the ACCUFLO Sacrificial Fill Materials available from Honeywell International Inc., including materials T-13EL, T25, and T-27.

b. Solvent

The formulation includes at least one high boiling point solvent and at least one low boiling point solvent.

Suitable high boiling point solvents may have a boiling point of at least 140° C., or as little as 140° C., 160° C., 180° C., as great as 210° C., 230° C., 250° C., or within any range defined between any two of the foregoing values, such as 140° C. to 250° C., 160° C. to 230° C., or 180° C. to 210° C. Exemplary high boiling point solvents include glycol ethers such as dipropylene glycol methyl ether (DPM), tripropylene glycol methyl ether (TPM), propylene glycol monomethyl ether acetate (PGMEA), n-propoxypropanol (NPP), propylene carbonate, gammabutyro lactone, ethyl lactate.

Suitable low boiling point solvents may have a boiling point of less than 125° C., or as little as 50° C., 75° C., as great as 100° C., 125° C., or within any range defined between any two of the foregoing values, such as 50° C. to 125° C. or 75° C. to 100° C. Exemplary low boiling point solvents include water, acetone, ethyl esters such as ethyl acetate, and lower molecular weight alcohols, such as methanol, ethanol, propanol, and butanol.

In one exemplary embodiment, the formulation comprises a high boiling point solvent having a boiling point of at least about 140° C., more particularly at least about 145° C., and even more particularly, at least about 150° C. The formulation also comprises a low boiling point solvent having a boiling point of at least 50° C., more particularly at least about 75° C., and even more particularly, at least about 100° C.

In one exemplary embodiment, the formulation comprises propylene glycol monomethyl ether acetate (PGMEA) as the high boiling point solvent and isopropyl alcohol (IPA) as the low boiling point solvent. In another exemplary embodiment, the formulation comprises propylene glycol monomethyl ether acetate (PGMEA) as the high boiling point solvent and acetone as the low boiling point solvent.

In one exemplary embodiment, the one or more high boiling point solvents comprise as little as 20 wt. %, 25 wt. %, 30 wt. %, 35 wt. %, or as great as 40 wt. %, 45 wt. %, 50 wt. % of the total weight of high boiling point and low boiling point solvents, or within any range defined between any two of the foregoing values, such as 20 wt. % to 50 wt. % or 30 wt. % to 40 wt. %.

In one exemplary embodiment, the one or more low boiling point solvents comprise as little as 20 wt. %, 25 wt. %, 30 wt. %, 35 wt. %, or as great as 60 wt. %, 65 wt. %, 70 wt. %, 75 wt. %, 80 wt. % of the total weight of high boiling point and low boiling point solvents, or within any range defined between any two of the foregoing values, such as 20 wt. % to 80 wt. % or 30 wt. % to 70 wt. %.

In another exemplary embodiment, the formulation comprises a mixture of two or more low boiling point solvents, such as acetone and isopropyl alcohol, with no high boiling point solvents.

In one exemplary embodiment, a weight ratio of the one or more high boiling point solvents to the one or more low boiling point solvents is as great as 1:1, 1:1.25, 1:1.5, 1:1.75, 1:2, as little as 1:2.25, 1:2.5, 1:2.75, 1:3, 1:4, 1:5 or within any range defined between any two of the foregoing values, such as 1:1 to 1:5, 1:1.5 to 1:4, or 1:1.5 to 1:3.

In one exemplary embodiment, the formulation comprises a total amount of solvent as little as 40 wt. %, 50 wt. %, 60 wt. %, 70 wt. %, 80 wt. %, as great as 90 wt. %, 92 wt. %, 95 wt. %, 97 wt. %, 98 wt. %, 99 wt. %, based on the total weight of the formulation, or within any range defined between any two of the foregoing values, such as 40 wt. % to 99 wt. %.

c. Other Additives

The formulation may further include one or more additives.

In some exemplary embodiment, the formulation includes one or more catalysts to improve the crosslinking of the silicon-based material. Exemplary catalysts include organic substituted ammonium hydroxide, such as TMAH (tetramethylammonium hydroxide), or organic substituted ammonium salts, such as TMAN (tetramethylammonium nitride). In some embodiments, the formulation comprises a total amount of catalyst as little as 0 wt. %, 0.001 wt. %, 0.01 wt. %, as great as 0.1 wt. %, 0.2 wt. %, 1.0 wt. %, based on the total weight of the formulation, or within any range defined between any two of the foregoing values, such as 0 wt. % to 1.0 wt. %, 0.01 wt. % to 0.1 wt. %, or 0.001 wt. % to 0.1 wt. %.

In some exemplary embodiment, the formulation includes one or more surfactants to improve the leveling of the silicon-based materials on the substrate. Exemplary surfactants include BYK-307, BYK-306, BYK-222 provided by BYK Chemie GmbH, Novec™ Fluorosurfactant FC-4430 provided by 3M, or Tego® Flow 300 provided by Evonik Industries AG. In some embodiments, the formulation comprises a total amount of surfactant as little as 0 wt. %, 0.001 wt. %, 0.01 wt. %, as great as 0.1 wt. %, 0.5 wt. %, 1.0 wt. %, 1.5 wt. %, 2.0 wt. %, based on the total weight of the formulation, or within any range defined between any two of the foregoing values, such as 0 wt. % to 1.0 wt. %, 0.01 wt. % to 0.1 wt. %, or 0.001 wt. % to 0.1 wt. %.

II. Coating

In some exemplary embodiments, the coating is formed by providing a composition including the resin, the high boiling point solvent, the low boiling solvent, and any additives, applying the composition to a substrate, and forming the coating removing the solvents from the applied composition.

In one exemplary embodiment, a first composition including a first solvent is provided, and a second solvent is added to the first composition. In one exemplary embodiment, the first composition includes a high boiling point solvent, and the second solvent is a low boiling point solvent. In another exemplary embodiment, the first composition includes a low boiling point solvent, and the second solvent is a high boiling point solvent.

In another exemplary embodiment, the coating is formed by a solvent exchange process. In an exemplary embodiment, a solution is provided with a mixture of multiple low boiling point solvents and no high boiling point solvents. High boiling point solvent is then added to the solution and many of the low boiling point solvents are stripped away by a rotary evaporator, leaving a mixture of a single low boiling point solvent with a single high boiling solvent. In this way, the low boiling point solvents are exchanged for the addition of a high boiling point solvent.

In yet another exemplary embodiment, the coating is formed by selecting a high boiling point solvent and a low boiling point solvent. The solvents are then mixed together and added to a resin. Further additives are then added to create the formulation described above.

Figure 4:
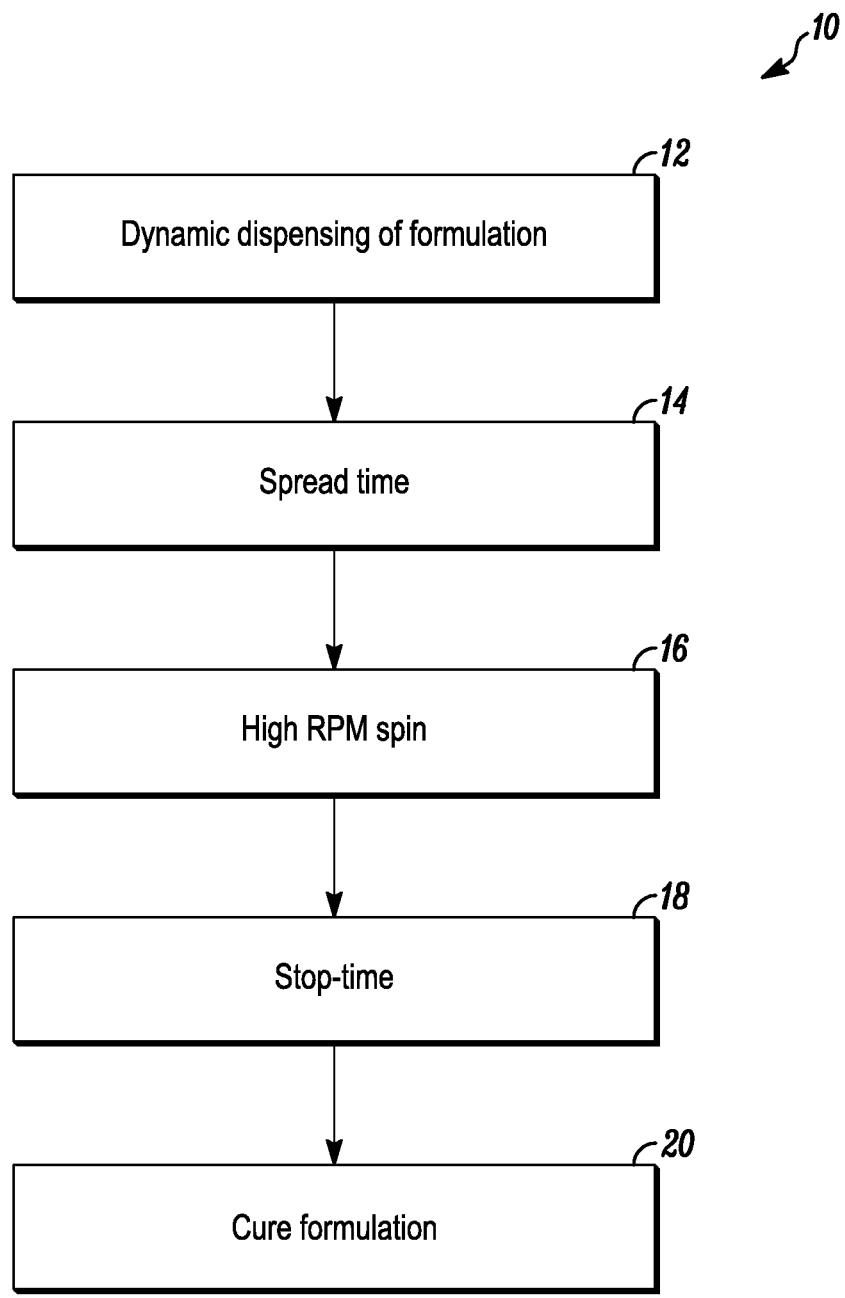
FIG. 4 illustrates an exemplary method of applying a film of Example 1 or Example 2 onto a substrate.

In one exemplary embodiment, spin coating methods are employed to apply the coating onto a surface of a wafer and to achieve a desired thickness of the coating. As shown in FIG. 4, method 10 includes a multi-step spin coating process. At block 12, the formulation is dynamically dispensed at a first wafer revolution speed. In an exemplary embodiment, the wafer is loaded onto spin plate and a fluid is applied onto the center of the wafer. The coating is then applied to the center of the wafer. After application, the wafer is then spun to allow the coating to cover the surface of the wafer. In an alternate embodiment, the coating is applied onto the surface of the wafer at a point away from the center of the wafer. The wafer is then spun to achieve full coverage of the surface of the wafer.

Exemplary application speeds may be at as little as 100 revolutions per minute (rpm), 150 rpm, 200 rpm, 250 rpm, as great as 350 rpm, 400 rpm, 450 rpm, 500 rpm, or within any range defined between any two of the foregoing values, such as 100 rpm to 500 rpm. Exemplary spin times may be as little as 1 second, 1.5 seconds, 2 seconds, as great as 3.5 seconds, 4 seconds, 4.5 seconds, 5 seconds, or within any range defined between any two of the foregoing values, such as 1 second to 5 seconds or 1 second to 2 seconds.

At block 14, the multi-step spin coating process then includes a spread-time during which the wafer is rotated without application of additional liquid formulation at a desired speed, and during which low boiling point solvents evaporate. Without wishing to be held to any particular theory, it is believed that the spread time allows the coating to flow and achieve a planar surface along the surface. Exemplary application speeds may be as little as 0 revolutions per minute (rpm), 100 rpm, 200 rpm, 300 rpm, as great as 400 rpm, 500 rpm, or within any range defined between any two of the foregoing values, such as 0 rpm to 500 rpm. Exemplary spin times may be as little as 10 seconds, 20 seconds, 30 seconds, as great as 40 seconds, 50 seconds, 60 seconds, or within any range defined between any two of the foregoing values, such as 20 to 60 seconds.

The period of time between dynamically dispensing the coating onto the wafer at block 10 and completing the spread-time of block 14 may constitute an evaporation time for the coating. In some embodiments, the evaporation time is as little as 2 seconds, 5 seconds, 10 seconds, as great as 15 seconds, 25 seconds, 30 seconds, or within any range defined between any two of the foregoing values, such as 2 seconds to 30 seconds. After an evaporation time has elapsed, the coating has a thickness as little as 5,000 Angstroms, 10,000 Angstroms, 15,000 Angstroms, 20,000 Angstroms, as great as 25,000 Angstroms, 30,000 Angstroms, 35,000 Angstroms, or within any range defined between any two of the foregoing values, such as 5,000 Angstroms to 30,000 Angstroms.

At block 16, the multi-step spin coating process then includes a high rpm spin during which the wafer is rotated without application of additional liquid formulation to establish a desired coating thickness as indicated at block 14 of FIG. 4. Exemplary application speeds may be as little as 1,000 revolutions per minute (rpm), 1,500 rpm, 2,000 rpm, 2,500 rpm, as great as 3,500 rpm, 4,000 rpm, 4,500 rpm, 5,000 rpm or within any range defined between any two of the foregoing values, such as 1,500 rpm to 5,000 rpm. Exemplary spin times may be as little as 10 seconds, 20 seconds, 30 seconds, as great as 40 seconds, 50 seconds, 60 seconds, or within any range defined between any two of the foregoing values, such as 20 to 60 seconds.

At block 18, the multi-step spin coating process then under goes a stop-time to facilitate flow of viscous fluid of a high boiling point solvent along the applied surface of indicated at block 16 of FIG. 4. Exemplary time periods for the stop-time include 10 seconds, 20 seconds, 30 seconds, as great as 40 seconds, 50 seconds, 60 seconds, or within any range defined between any two of the foregoing values, such as 20 to 60 seconds.

After application of the coating, at block 20, the coating is cured onto the applied surface as indicated at block 18 of FIG. 4. Exemplary temperatures for curing may be as little as 100° C., 200° C., 300° C., as great as 600° C., 700° C., 800° C., 900° C., or within any range defined between any two of the foregoing values, such as 200° C. to 800° C. Curing times may be as little as 1 minute, 10 minutes, 20 minutes, as great as 40 minutes, 50 minutes, 60 minutes, 70 minutes, or within any range defined between any two of the foregoing values, such as 1 minute to 60 minutes.

In some exemplary embodiments, the material is formed as a gap filling or planarizing layer on a suitable substrate. Exemplary substrates include a dielectric film, a polysilicon film, a dielectric-metal layer, a metal-silicon layer, or an organic layer, such as positioned on a silicon wafer as used in semiconductor manufacturing processes.

The formed layer has a planarity that depends on the width of the feature to be filled. In an exemplary embodiment, the width of the features is as little as 2 µm, 3 µm, 4 µm, 5 µm, as great as 7 µm, 8 µm, 9 µm, 10 µm, or within any range defined between any two of the foregoing values. In some exemplary embodiments, the formed layer may have a planarity of as little as 60%, 70%, 80%, as great as 90%, 95%, 99%, or within any range defined between any two of the foregoing values depending on the aforementioned size of the gaps to be filled.

Planarization performance can be primarily evaluated by how effective the topography is reduced. The topography prior to and after planarization is evaluated. The percentage of topography reduction (or planarization improvement) is expressed as Degree of Planarization (DOP, or % planarization) and can be calculated as following:

$$DOP\ (\%\ planarization) = (1 - (T'/T)) \times 100,$$

where T' is the step height over a topographic structure after planarization, and T is the initial topographic structure step height prior to planarization. A perfect planarization has a DOP of 100%, where T' equals 0 and the topography over the topographic structure is eliminated after planarization.

In one exemplary embodiment including a feature having a width of about 2 µm, the formed layer may have a planarity as little as 93%, 94%, 95% as great as 97%, 98%, 99%, or within any range defined between any two of the foregoing values, such as 93% to 99% or 95% to 99%. In an exemplary embodiment including a feature having a width of about 5 µm, the formed layer may have a planarity as little as 81%, 85%, 90% as great as 95%, 97%, 99%, or within any range defined between any two of the foregoing values, such as 81% to 98.5% or 90% to 95%. In an exemplary embodiment including a feature having a width of about 10 µm, the formed layer may have a planarity as little as 60%, 70%, 80% as great as 90%, 95%, 100%, or within any range defined between any two of the foregoing values, such as 60% to 100%, 90 to 100%, or 95% to 100%.

As applied, the coating on the substrate has a thickness. In one exemplary embodiment, the coating has a thickness of as little as 5,000 Angstroms, 6,000 Angstroms, 7,000 Angstroms, as great as 10,000 Angstroms, 11,000 Angstroms, 12,000 Angstroms, 13,000 Angstroms, 14,000 Angstroms, or within any range defined between any two of the foregoing values, such as 5,000 Angstroms to 13,000 Angstroms.

EXAMPLES

Example 1

Formulations with High and Low Boiling Point Solvents

Samples of coating formulations were prepared according to the weight ratios provided in Table 1:

TABLE 1

| Coating formulations (weight percent) | | | | | |
|---|---|---|---|---|---|
| Component | Comp. Ex. 1 | Comp. Ex. 2 | Ex. 1 | Ex. 2 | Ex. 3 | Ex. 4 |
| Resin 1 | 20 | — | 20 | — | — | — |
| Resin 2 | — | 20 | — | 10 | 20 | — |
| Resin 3 | — | — | — | — | — | 12 |
| PGMEA | 80 | 80 | 24 | 24 | 24 | — |
| Acetone | — | — | — | — | 56 | 29.3 |
| IPA | — | — | 56 | 56 | — | 58.7 |

Resin 1 was a silicon-based resin available under the tradename PTS from Honeywell International Inc. Resin 2 was an organic-based resin available under the tradename ACCUFLO from Honeywell International Inc. Resin 3 was a methyl-siloxane based resin available under the tradename ACCUGLASS T-12 from Honeywell International Inc.

The coatings provided in Table 1 were applied via a spin coating technique. The spin coating technique includes initially spin coating the coating onto the surface, followed by static dispensing of the coating along the surface, followed by a spread-time at 300 rpm while low boiling points solvents evaporate off, followed by a 1500 rpm spin for 20 seconds to establish a desired film thickness, and finally a stop-time to facilitate flow of viscous liquid of high boiling point solvent to achieve a planar surface. All coatings were baked on hotplates at less than 200° C. for a few minutes.

The thickness of the resulting coating at various evaporation times is provided in Table 2.

TABLE 2

Formulation properties and resulting thicknesses in Angstroms (Å)

| Evaporation Time (sec) | Comp. Ex. 1 | Ex. 1 | Ex. 2 | Comp. Ex. 2 | Ex. 3 | Ex. 4 |
|---|---|---|---|---|---|---|
| 0 | 8,071 | 13,783 | 5,834 | 5,860 | 12,425 | 7,189 |
| 2 | | 14,284 | | | | |
| 5 | 8,329 | 16,138 | 6,887 | 5,991 | 23,800 | 7,418 |
| 10 | | | | | | 7,799 |
| 15 | 9,159 | 25,546 | 11,065 | 6,812 | 26,885 | |
| 25 | | | | | | 13,882 |
| 30 | 11,562 | 26,864 | 13,443 | 9,188 | 30,089 | |

Figure 2:
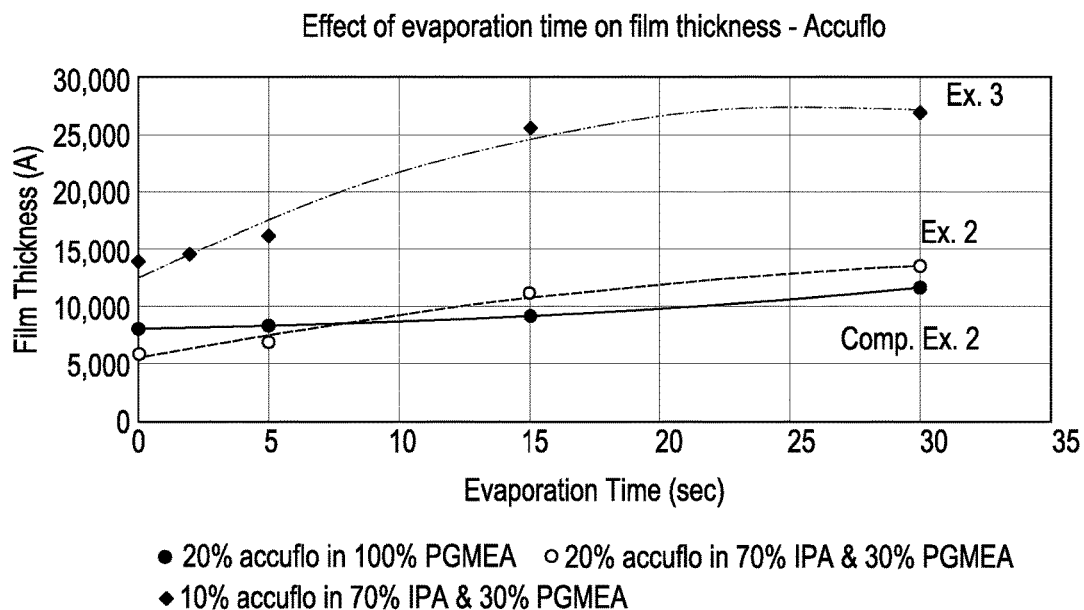
FIG. 2 is related to Example 1 and shows the effect of evaporation time on film thickness for an organic-resin based composition.
Figure 3:
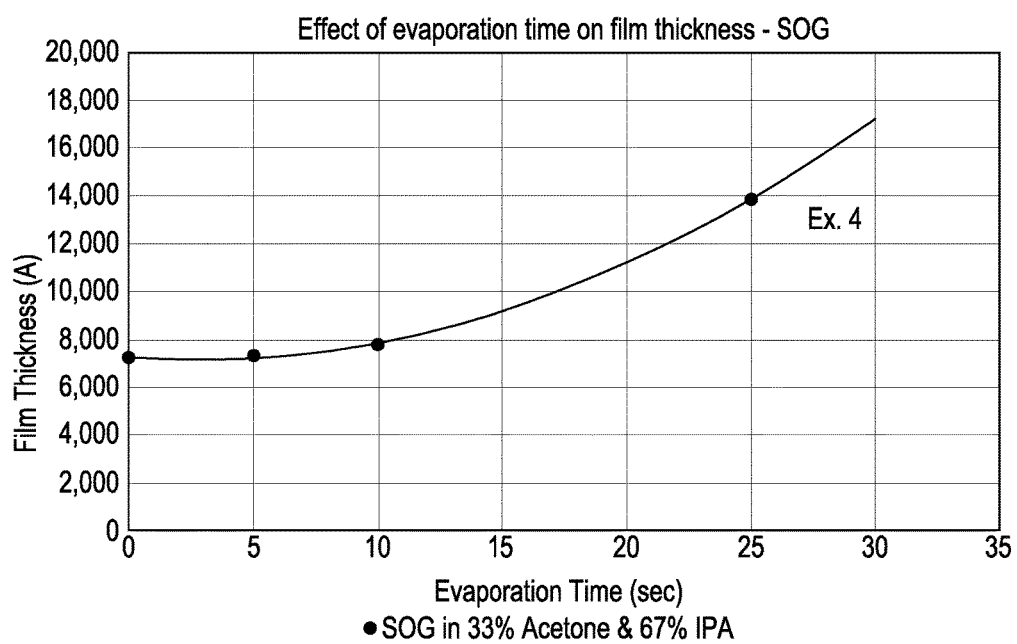
FIG. 3 is related to Example 2 and shows the effect of evaporation time of film thickness for a methyl-siloxane resin based composition.

The data presented in Table 2 is further illustrated in FIGS. 1-3, which compares the film thickness in Angstroms as a function of the elapsed evaporation time in seconds.

Referring first to FIG. 1, data for two formulations of 20 wt. % Resin 1 are shown. Comparative Example 1 includes 80 wt. % of PGMEA, while Example 1 includes a mixture of 24 wt. % PGMEA (boiling point 145-146° C.) and 56 wt. % Acetone (boiling point 56° C.). As can be seen in FIG. 1, the combination of PGMEA and Acetone in Example 1 provides greater film thickness over an evaporation time of 30 seconds than Comparative Example 1.

Referring now to FIG. 2, data for three formulations containing Resin 2 are shown. Comparative Example 2 and Example 3 include 20 wt. % of Resin 2, while Example 2 includes 10 wt. % of Resin 2. Comparative Example 2 includes 80 wt. % of PGMEA, while Examples 2 and 3 include 56 wt. % of IPA (boiling point 82.6° C.) and 24 wt. % of PGMEA (boiling point 145-146° C.). As can be seen in FIG. 2, the combination of PGMEA and IPA with a lower resin concentration in Example 3 provides greater film thickness over an evaporation time of 30 seconds than Example 2 and Comparative Example 2. Example 2 also provides a greater film thicknesses as compared to Comparative Example 2 as evaporation time progressed. Example 2 had a greater film thickness starting from around 10 seconds; however, before this time, Example 2 provides thicknesses that are less than or equal to Comparative Example 2.

As shown in FIGS. 1 and 2, formulations with a mixture of solvents showed greater film thickness than formulations with a single solvent. Moreover, formulations with a solvent mixture that include both a high boiling point solvent and a low boiling point solvent show improved film thicknesses compared to the single solvent alternatives regardless of the resin used.

Example 2

Example 1: Formulations with Multiple Low Boiling Point Solvents

A sample of a coating formulation of Ex. 4 was prepared according to the weight ratios provided in Table 1. The coatings was applied via a spin coating technique. The spin coating technique includes initially spin coating the coating onto the surface, followed by static dispensing of the coating along the surface, followed by a spread-time at 300 rpm while the lower boiling point solvent isopropyl alcohol evaporated off, followed by a 1500 rpm spin for 20 seconds to establish a desired film thickness, and finally a stop-time to facilitate flow of the relatively higher boiling point acetone to achieve a planar surface. All coatings were baked on hotplates at less than 200° C. for a few minutes.

The thickness of the resulting coating at various evaporation times is provided in Table 2.

Referring next to FIG. 3, data is shown for Example 4, which includes 12 wt. % of Resin 3 with a solvent mixture of two low boiling point solvents –29.3 wt. % Acetone and 58.7 wt. % IPA. FIG. 3 shows an increasing trend in film thickness as evaporation time increased indicating that a mixture of low boiling point solvents with an appropriate amount of spread time can result in coatings with good thickness characteristics.

As shown in FIG. 3, formulations with a mixture of solvents showed greater film thickness than formulations with a single solvent.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The invention claimed is:

1. A method of applying a coating onto a substrate, comprising:
    dispensing the coating onto the substrate, wherein the coating includes:
        a resin comprising one or more silicon-based materials, one or more organic-based materials, or a combination of silicon-based materials and organic-based materials;
        at least one first solvent having a boiling point from 140° C. to 250° C.; and at least one second solvent having a boiling point from 50° C. to 120° C.; wherein a weight ratio of the first solvent to the second solvent is from 1:1 to 1:5;
    spinning the substrate at a first speed, at least one of prior to and during the dispensing step;
    spinning the coating at a second speed that is less than or equal to the first speed such that the coating spreads over the surface of the substrate and achieves a planar surface;
    increasing the speed to a third and final speed that is greater than the first speed and the second speed such that a desired film thickness is established; and
    providing a stop time of between 10 and 60 seconds after the third and final speed before
    a subsequent heating to facilitate flow to achieve the planar surface.

2. The method of claim 1, wherein the first speed is between 100 revolutions per minute and 500 revolutions per minute; the second speed is between 0 revolutions per minute and 500 revolutions per minute; and the third speed is between 1000 revolutions per minute and 5000 revolutions per minute.

3. The method of claim 1, wherein the low boiling point solvent includes at least one solvent selected from the group consisting of acetone, ethyl acetate, methanol, ethanol, propanol, butanol, and isopropyl alcohol.

4. The method of claim 1, wherein the high boiling point solvent includes at least one solvent selected from the group consisting of dipropylene glycol methyl ether, tripropylene glycol methyl ether, propylene glycol monomethyl ether acetate, n-propoxypropanol, and propylene carbonate, and gammabutryo lactone.

5. The method of claim 1, wherein the resin comprises one or more silicon-based materials formed from one or more organoalkoxysilane precursors selected from the group consisting of: tetraethylorthosilicate (TEOS), methyltrimethoxysilane (MTMOS), methyltriethoxysilane (MTEOS), dimethyldiethoxysilane (DMDEOS), phenyl triethoxysilane (PTEOS), vinyltriethoxysilane (VTEOS), dimethyldimethoxysilane, phenyltrimethoxysilane, and combinations of the foregoing.

6. The method of claim 5, wherein the first solvent is propylene glycol monomethyl ether acetate; and wherein the second solvent is isopropyl alcohol.

7. The method of claim 1, wherein the resin comprises one or more organic-based materials selected from the group consisting of o-cresol, formaldehyde, and novolac-based resins; wherein the first solvent is propylene glycol monomethyl ether acetate.

8. The method of claim 7, wherein the second solvent is selected from acetone and isopropyl alcohol.

9. A method of applying a coating onto a substrate, comprising:
dispensing the coating onto the substrate, wherein the coating includes:
a resin comprising one or more silicon-based materials, one or more organic-based materials, or a combination of silicon-based materials and organic-based materials;
at least one first solvent having a boiling point from 140° C. to 250° C.; and at least one second solvent having a boiling point from 50° C. to 120° C.; wherein a weight ratio of the first solvent to the second solvent is from 1:1 to 1:5;
spinning the substrate at a first speed, at least one of prior to and during the dispensing step;
spinning the coating at a second speed that is less than or equal to the first speed such that the coating spreads over the surface of the substrate, achieves a planar surface, and evaporates the second solvent;
increasing the speed to a third and final speed that is greater than the first speed and the second speed such that a desired film thickness is established; and
providing a stop time of between 10 and 60 seconds after the third and final speed before
a subsequent heating to facilitate flow to achieve the planar surface;
wherein the first speed is between 100 revolutions per minute and 500 revolutions per minute;
the second speed is between 0 revolutions per minute and 500 revolutions per minute; and
the third and final speed is between 1000 revolutions per minute and 5000 revolutions per minute.

10. The method of claim 9, wherein the low boiling point solvent includes at least one solvent selected from the group consisting of acetone, ethyl acetate, methanol, ethanol, propanol, butanol, and isopropyl alcohol.

11. The method of claim 9, wherein the high boiling point solvent includes at least one solvent selected from the group consisting of dipropylene glycol methyl ether, tripropylene glycol methyl ether, propylene glycol monomethyl ether acetate, n-propoxypropanol, and propylene carbonate, and gammabutryo lactone.

* * * * *